United States Patent
Nakao et al.

(10) Patent No.: US 7,441,999 B2
(45) Date of Patent: Oct. 28, 2008

(54) OVERHEAD TRAVELLING CARRIAGE SYSTEM

(75) Inventors: Takashi Nakao, Neyagawa (JP); Makoto Tanaka, Otsu (JP)

(73) Assignee: Murata Kikai Kabushiki Kaisha, Kyoto-shi (JP)

( * ) Notice: Subject to any disclaimer, the term of this patent is extended or adjusted under 35 U.S.C. 154(b) by 55 days.

(21) Appl. No.: 11/004,886

(22) Filed: Dec. 7, 2004

(65) Prior Publication Data

US 2005/0139564 A1 Jun. 30, 2005

(30) Foreign Application Priority Data

Dec. 26, 2003 (JP) ............................. 2003-432431
Jun. 24, 2004 (JP) ............................. 2004-186312

(51) Int. Cl.
*H01L 21/677* (2006.01)
(52) U.S. Cl. ................................. 414/217.1; 414/940
(58) Field of Classification Search .............. 414/217.1, 414/940
See application file for complete search history.

(56) References Cited

U.S. PATENT DOCUMENTS

| | | | | |
|---|---|---|---|---|
| 5,570,990 | A * | 11/1996 | Bonora et al. ................ | 414/543 |
| 6,079,927 | A * | 6/2000 | Muka .......................... | 414/217 |
| 6,113,341 | A | 9/2000 | Fukushima | |
| 6,283,692 | B1 * | 9/2001 | Perlov et al. ............. | 414/222.01 |
| 6,450,318 | B1 | 9/2002 | Minardi | |
| 6,468,021 | B1 * | 10/2002 | Bonora et al. ................ | 414/522 |
| 6,471,460 | B1 * | 10/2002 | Pedersen et al. ........ | 414/222.09 |
| 6,579,052 | B1 * | 6/2003 | Bonora et al. ........... | 414/222.01 |
| 6,599,075 | B2 * | 7/2003 | Davis et al. .................. | 414/217 |
| 6,604,624 | B2 * | 8/2003 | Hirata et al. ................. | 198/494 |
| 6,726,429 | B2 * | 4/2004 | Sackett et al. ............... | 414/217 |
| 7,134,825 | B1 * | 11/2006 | Schmutz et al. .......... | 414/217.1 |
| 2002/0003994 | A1 * | 1/2002 | Davis et al. ............. | 414/225.01 |
| 2003/0235486 | A1 | 12/2003 | Doherty et al. | |
| 2004/0047714 | A1 * | 3/2004 | Poli et al. .................... | 414/281 |
| 2004/0109746 | A1 | 6/2004 | Suzuki | |
| 2004/0126208 | A1 * | 7/2004 | Tawyer et al. .......... | 414/222.02 |
| 2005/0008467 | A1 * | 1/2005 | Huang et al. ................ | 414/626 |

FOREIGN PATENT DOCUMENTS

| | | |
|---|---|---|
| JP | 06-298305 | 10/1994 |
| JP | 10-45213 A * | 2/1998 |
| JP | 10-279279 | 10/1998 |
| JP | 3067656 | 5/2000 |
| JP | 2000-255710 | 9/2000 |
| JP | 2001-301914 | 10/2001 |
| WO | WO 03-088350 | 10/2003 |

OTHER PUBLICATIONS

Notification of Reason(s) for Refusal of the Japanese Patent Application No. 2004-186312 from the Japanese Patent Office (with English translation).

* cited by examiner

*Primary Examiner*—Thomas J. Brahan
(74) *Attorney, Agent, or Firm*—Westerman, Hattori, Daniels & Adrian, LLP.

(57) ABSTRACT

An overhead buffer 24 is provided on a side of a running rail 4 for an overhead travelling carriage 8. The height level of an article on the overhead buffer 24 is slightly lower than that on the running overhead travelling carriage 8. This height is at least such that the overhead buffer 24 does not interfere with an operator. According to the present invention, the overhead buffer can be installed even if load ports are consecutively provided.

6 Claims, 8 Drawing Sheets

OVERHEAD TRAVELLING CARRIAGE SYSTEM

FIELD OF THE INVENTION

The present invention relates to an overhead travelling carriage system, and in particular, to an overhead buffer for temporarily storing an article.

BACKGROUND OF THE INVENTION

In an overhead travelling carriage system, an article is conveyed by running an overhead travelling carriage along a running rail installed close to a ceiling in a clean room or the like. An overhead buffer can be effectively installed close to a load port (a ground workstation provided in a processing device or the like) in order to increase the efficiency of the overhead travelling carriage system. The Japanese Patent No. 3067656 proposes provision of an overhead buffer between load ports and below the running rail. However, if load ports are consecutively arranged, there is no space enough to provide the overhead buffer between the load ports.

SUMMARY OF THE INVENTION

It is an object of the present invention to provide an overhead travelling carriage system that allows an overhead buffer to be installed even though there is no space between load ports.

It is an object of the aspect of the present invention in Claim 2 to allow an article to be easily transferred between the load port and the overhead buffer. Another object of this aspect is to use a mechanism for controlling stopping at the load port to control stopping at the overhead buffer.

It is an object of the aspect of the present invention in Claim 3 to allow the article to be easily transferred between the overhead travelling carriage and the overhead buffer.

According to the present invention, there is provided an overhead travelling carriage system comprising an overhead travelling carriage that elevates and lowers a platform to load an article on a load port in a processing device provided below a running rail, the overhead travelling carriage running along the running rail, characterized in that:

an overhead buffer is provided on a side of the running rail so that an article placement surface is located below a bottom surface of the article on the running overhead travelling carriage, and the overhead travelling carriage is provided with means for laterally moving the platform to above the overhead buffer so that the article can be transferred and loaded between the overhead buffer and the load port below the running rail.

In a broad sense, the processing device includes a device that inspects articles, in addition to a device that processes articles to be conveyed (the processing device in a narrow sense). The overhead buffer means a buffer located close to a ceiling in a building such as a clean room. The overhead buffer does not necessarily mean a buffer supported on the ceiling.

Preferably, the overhead buffer is placed so that the article can be transferred to the overhead travelling carriage at almost the same position as that of the load port in a plan view and with respect to a running direction of the running rail.

Further, preferably, means for preventing the article from falling is provided so as to project upward from the overhead buffer, and a top portion of the fall preventing means is located slightly below a bottom surface of the article on the running overhead travelling carriage.

In the overhead travelling carriage system according to the present invention, the overhead buffer is provided on a side of the running rail, for example, opposite the processing device with respect to the running rail. Accordingly, the overhead buffer can be installed even if the load ports are consecutively arranged in the processing device, so that there is no space between the load ports and below the running rail. This allows the overhead buffer to be efficiently provided close to the load port. Further, the overhead buffer can be provided at a higher position than when it is provided below the running rail and between the load ports. It is thus possible to effectively utilize a space located below the overhead buffer. The overhead travelling carriage is provided with the means for laterally moving the platform toward the overhead buffer. The overhead buffer supports the article below the bottom surface of the article placed on the running overhead travelling carriage. Accordingly, when the platform is laterally moved toward the overhead buffer and is then lowered, the article can be transferred between the overhead buffer and the platform. Thus, the lateral movement of the platform is combined with its elevation and lowering and further with the running of the overhead travelling carriage if required to enable the article to be transferred between the overhead buffer and the load port.

According to the aspect of the present invention in Claim 2, the overhead buffer is placed so as to transfer the article to and from the overhead travelling carriage, at almost the same position as that of the load port in the running direction of the running rail. For example, the overhead buffer is placed opposite the load port. Thus, for example, a dog (mark) for controlling the stopping of the overhead travelling carriage at the load port can be used to control the stopping of the overhead travelling carriage at the overhead buffer. This allows the dog to be easily attached to the running rail or the like. Further, for the transfer between the overhead buffer and the load port, the overhead travelling carriage need not be run, or even if it is run, it has only to run a short distance. This facilitates the transfer between the overhead buffer and the load port.

According to the aspect of the present invention in Claim 3, the fall preventing means is provided in the overhead buffer to prevent the article from falling. Further, when the platform is moved from the overhead travelling carriage to the overhead buffer, the bottom surface of the article passes slightly above, for example, 3 to 30 cm above a top portion of the fall preventing means. Thus, when the platform is moved forward from the overhead travelling carriage to the overhead buffer and is then slightly lowered, the article can be transferred between the overhead travelling carriage and the overhead buffer. Moreover, a high space can be created below the overhead buffer. Consequently, when a position lower than the bottom surface of the overhead buffer is considered to be an effective space, a large effective space can be obtained. Thus, a ceiling located lower than conventional ones can be used to obtain the same effective space.

DETAILED DESCRIPTION OF THE PREFERRED EMBODIMENTS

An optimum embodiment will be shown below which implements the present invention.

FIGS. 1 to 6 show an embodiment.

Figure 1:
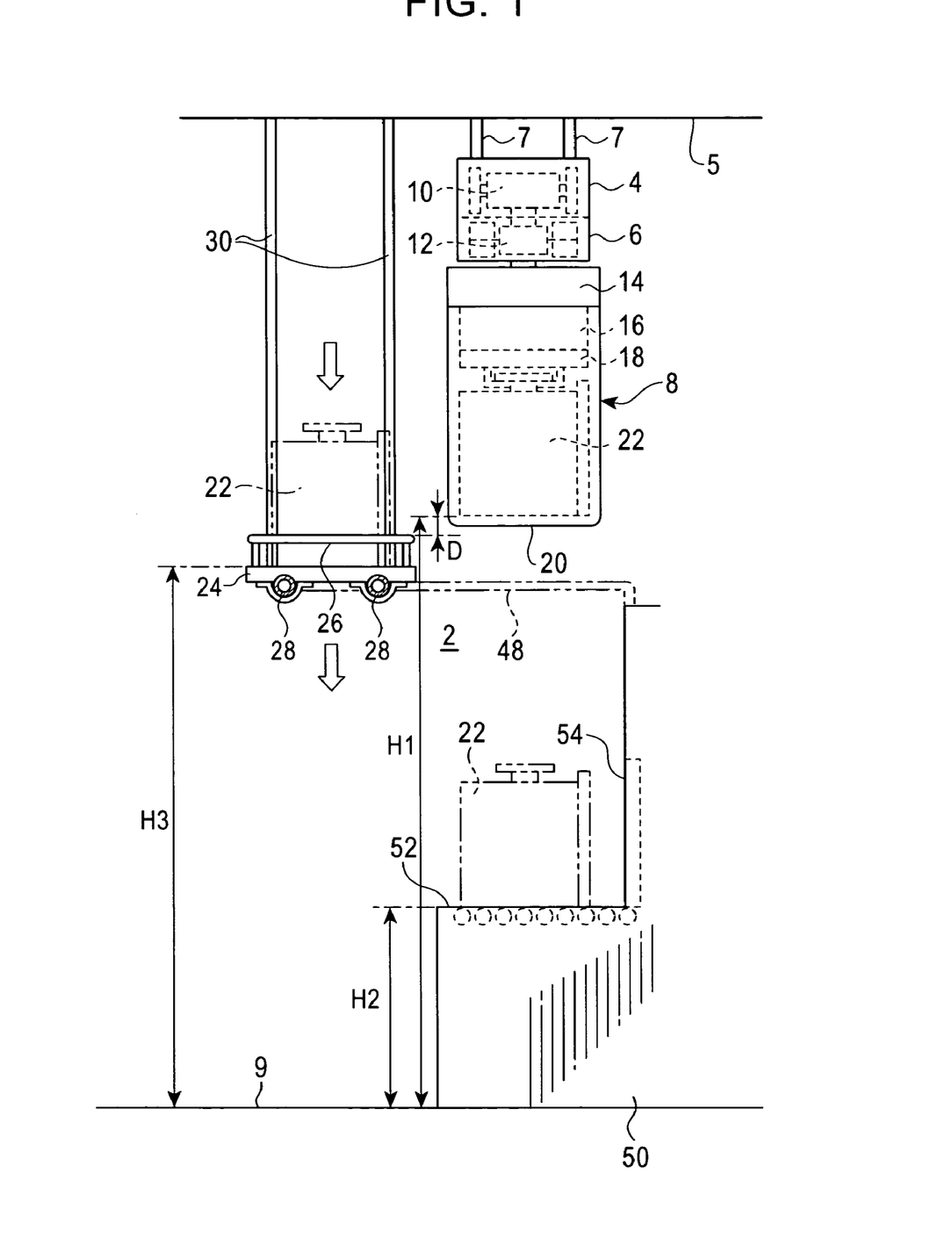
FIG. 1 is a front view showing an overhead travelling carriage and an overhead buffer in an overhead travelling carriage system according to an embodiment.

2 is an overhead travelling carriage system installed in a clean room or the like. 4 is a running rail hung from a ceiling 5 in a supportive manner using hanging bolts 7. An electricity feeding rail 6 is mounted on a bottom surface of the running rail 4. An overhead travelling carriage 8 comprises a running driving section 10 that runs through the running rail 4 and a non-contact electricity feeding section 12 that receives electricity fed through the electricity feeding rail 6 by means of, for example, non-contact electricity feeding. The electricity feeding rail 6 is provided with, for example, a communication line used between the overhead travelling carriage 8 and a controller (not shown in the drawings) and a dog for controlling stopping at a load port. The non-contact electricity feeding section 12 is provided not only with a coil for non-contact electricity feeding but also with a transmission and reception section that transmits and receives signals to and from the controller through the communication line and a sensor that detects the dog.

Figure 2:
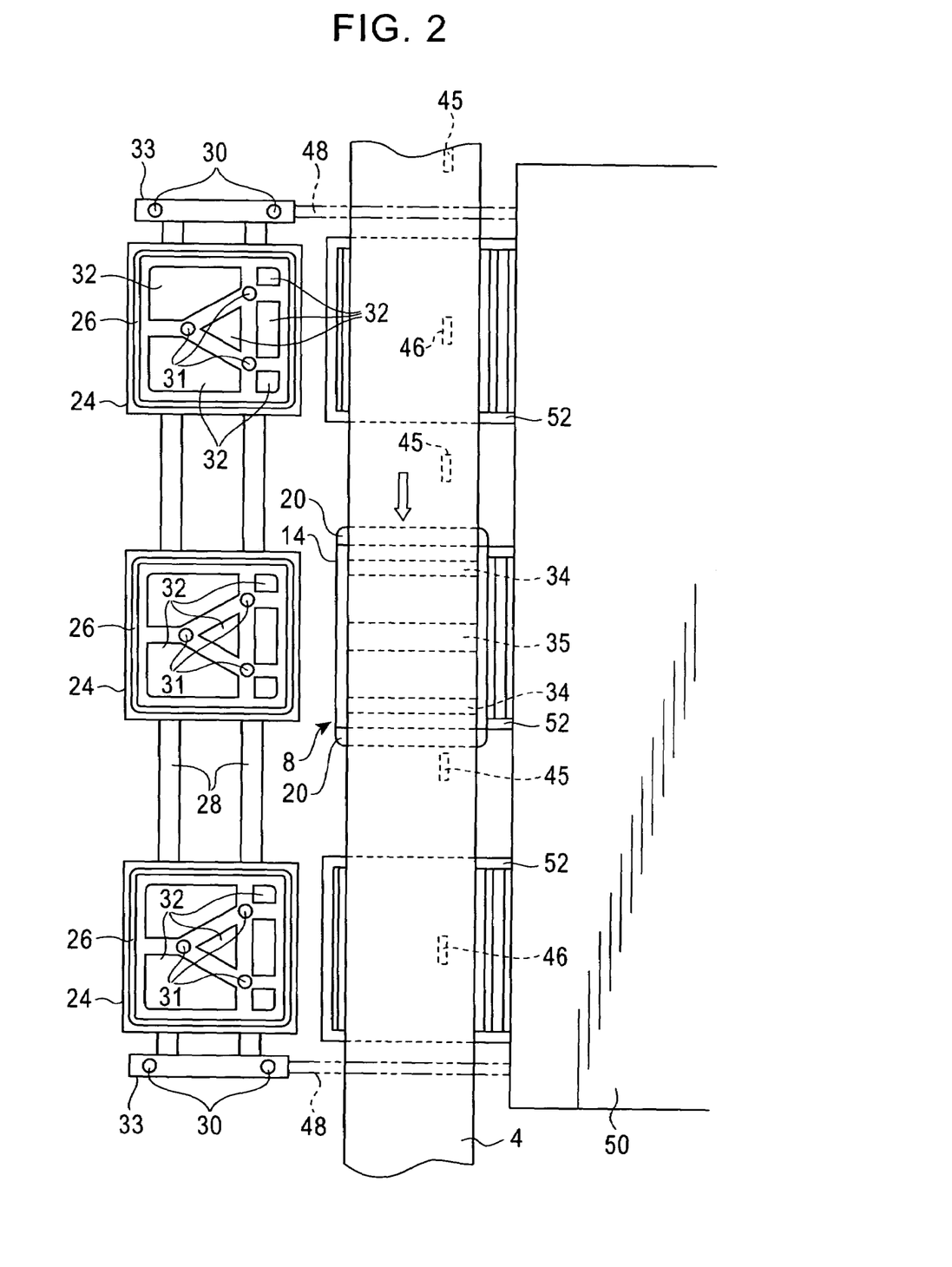
FIG. 2 is a plan view of an essential part of the overhead travelling carriage system according to the embodiment, showing a running rail for the overhead travelling carriage and the overhead buffer.

14 is a lateral feeding section that moves an elevation driving section 16 and a platform 18 to a side of the running rail 4. The elevation driving section 16 and the platform 18 are not moved to both sides of the running rail 4 but only to the side opposite to a processing device 50 (to the left of FIG. 1). The lateral feeding section 14 moves the elevation driving section 16 and the platform 14 to and from one side of the running rail 4. As shown in FIG. 2, paired linear guides 34 guide the elevation driving section 16 to the lateral feeding section 14 of the overhead travelling carriage 8. A lateral drive 35 moves the elevation driving section 16 to and from a side of the running rail 4. Fall preventing members 20 are provided, for example, in front of and behind the overhead travelling carriage 8 to prevent a cassette 22, an example of an article to be conveyed, from falling from the platform 18 owing to vibration during running. The cassette 22 accommodates a semiconductor substrate or the like. The platform 18 chucks and supports a flange or the like which projects from a top surface of the cassette 22.

24 is an overhead buffer provided on one side of the running rail 4 opposite the processing device 50. A fall preventing fence 26 is provided on the overhead buffer 24 to prevent the cassette 22 from falling. Here, the fall preventing fence 26 is shown placed all along the periphery of the overhead buffer 24 so as to have a uniform height. However, the fall preventing fence 26 may be lower on the overhead travelling carriage 8 side and higher on the opposite side. The overhead buffer 24 is supported by, for example, paired parallel pipe-like supports 28. End plates 33 or the like are provided at the opposite ends of each of the supports 28. The supports 28 are hung from, for example, the ceiling 5 using hanging bolts 30. 31 is positioning pins provided on the overhead buffer 24. The positioning pins 31 are fitted into concave portions in a bottom surface of the cassette 22 to position it.

Fall preventing means are composed of the fall preventing fence 26 and the positioning pins 31. The fall preventing fence 26 projects upward from the overhead buffer 24 to a position higher than the positioning pins 31. Accordingly, the height of a part of the fall preventing fence 26 which is closer to the overhead travelling carriage 8 is equal to that of a top portion of the fall preventing means. Without the fall preventing fence 26, the height of the positioning pins 31 is equal to that of the top portion of the fall preventing means. An opening 32 is formed in the overhead buffer 24 so as not to block the flow of clean air blown downward from the ceiling 5 toward a floor surface 9. More preferably, the overhead buffer 24 is composed of transparent plastics so as to allow an operator to visually check the overhead buffer 24 for the presence of the cassette 22 easily.

50 is a processing device for semiconductors or the like which may be an inspection device or the like. 52 is a load port on which a conveyor or the like is provided. 54 is an access port through which the cassettes 22 is loaded into and unloaded out of the processing device 50. In this case, the end plates 33 are hung from the ceiling 5 in a supportive manner using the hanging bolts 30. However, the end plates 33 may be supported by a pillar 48 shown by a chain line and supported by the processing device 50.

The height of each section will be described.

The height H1 of a bottom surface of the cassette 22 on the running overhead travelling carriage 8 is, for example, about 2,500 to 3,000 mm. The height H2 of the load port 52 is, for example, about 800 to 1,000 mm. Accordingly, the operator can load and unload the cassette 22 on and from the load port 52. The height H3 of the overhead buffer 24 is preferably such that the overhead buffer 24 does not interfere with the operator. The height H3 is, for example, at least 2,000 mm. The difference D in height between the top of a surface of the fall preventing fence 26 which is closer to the overhead travelling carriage 8 and the bottom surface of the cassette 22 on the running overhead travelling carriage 8 is, for example, about 30 to 300 mm, and in this case, 100 mm.

As shown in FIG. 2, the overhead buffer 24 is provided opposite the load port 52 in a plan view. The load port 52 is located immediately below the running rail 4. The overhead buffer 24 is located opposite the processing device 50 with respect to the running rail 4 and above the load port 52. The load port 52 is provided immediately below the running rail 4 at almost the same position as that of the overhead buffer 24 in a plan view along the running direction of the overhead travelling carriage 8. The overhead buffer 24 is preferably provided on one of the right and left sides of the running rail 4. The difference in position (the difference in position along the running direction of the overhead travelling carriage; also called a shift) between the load port 52 and the overhead buffer 24 is, for example, at most 300 mm. A dog (a mark for controlling the overhead travelling carriage) is provided on the feeding rail, provided under the running rail 4. A dog 45 indicates the presence of a load port provided upstream of the load port 52 in the running direction. A dog 46 is used to control stopping. Only one of the two dogs 45, 46 may be provided. In the embodiment, in the running direction of the running rail 4, the position of the overhead buffer 24 is the same as that of the load port 52. When the overhead travelling carriage 8 stops for the load port 52, it can also stop at the correct position for the overhead buffer 24.

If the overhead buffer 24 cannot be installed at the same position as that of the load port 52 along the running direction of the overhead travelling carriage 8 for the convenience of mounting or the like, then for example, it may be shifted, for example, forward from the load port 52 in the running direction of the overhead travelling carriage 8 by about 50 to 300 mm along the running direction. In this case, to stop at the overhead buffer 24, the overhead travelling carriage 8 may be stopped at a position obtained by shifting the stopped position of the load port 52 forward by a predetermined distance, the stopped position being determined on the basis of the dogs 45, 46. Further, if the overhead buffer 24 is shifted forward (upstream) from the load port 52 in the running direction of the overhead travelling carriage 8, the upstream dog 45 may be used to control stopping.

Figure 3:
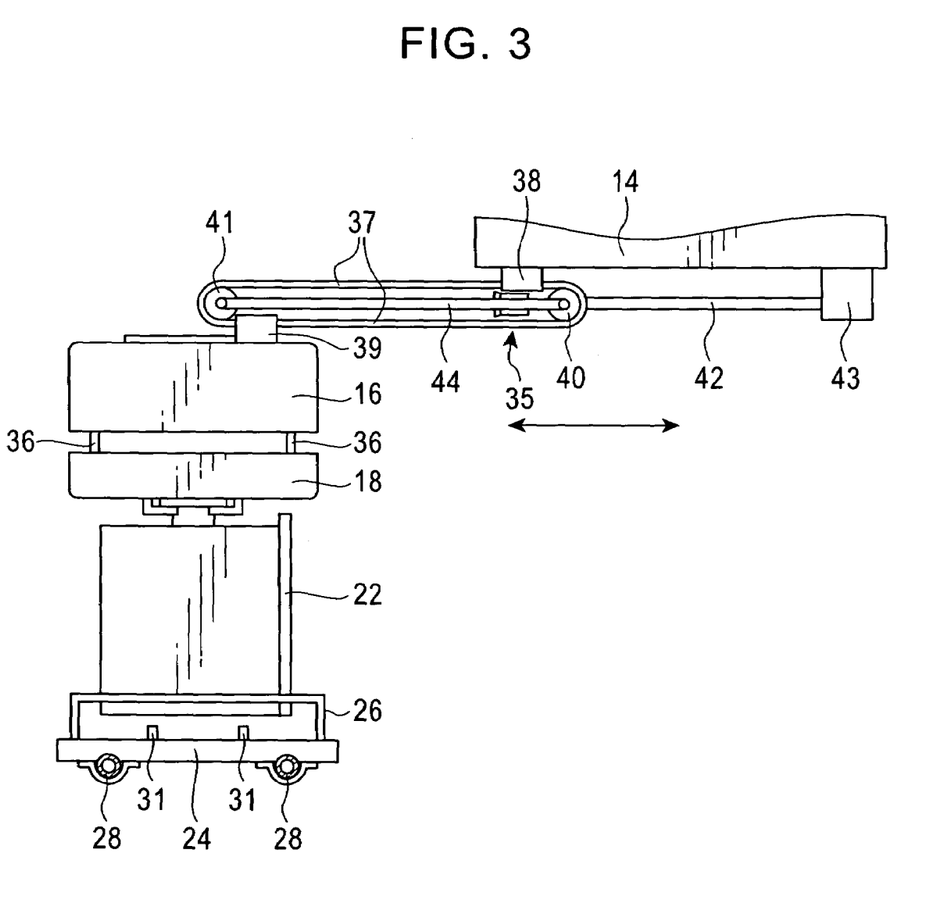
FIG. 3 is a diagram schematically showing a lateral movement mechanism for the overhead travelling carriage according to the embodiment.

FIG. 3 shows that the cassette 22 is being loaded on the overhead buffer 24. The platform 18 is hung from the elevation driving section 16 in a supportive manner using a hanging material 36 such as a belt, a rope or a zone plate. The hanging material 36 is fed or taken up to elevate or lower the platform 18. 37 is an endless belt such as a timing belt. An upper side of the loop of the belt 37 is fixed to the lateral feeding section 14 using a fixing section 38. A lower side of the loop of the belt 37 is fixed to the elevation driving section 16 using a fixing section 39. 40, 41 are paired sprockets (gears). 42 is a ball screw, and 43 is a ball screw driving mechanism. 44 is a frame. When the ball screw 42 is rotated to move the frame 44 in the lateral direction of FIG. 3, the fixing section 39 is moved in the lateral direction by a stroke double that of the frame 44. Alternatively, a linear guide or the like guides the lateral movement of the elevation driving section 16. An arbitrary mechanism can be used to feed the elevation driving section 16 in the lateral direction.

Figure 4:
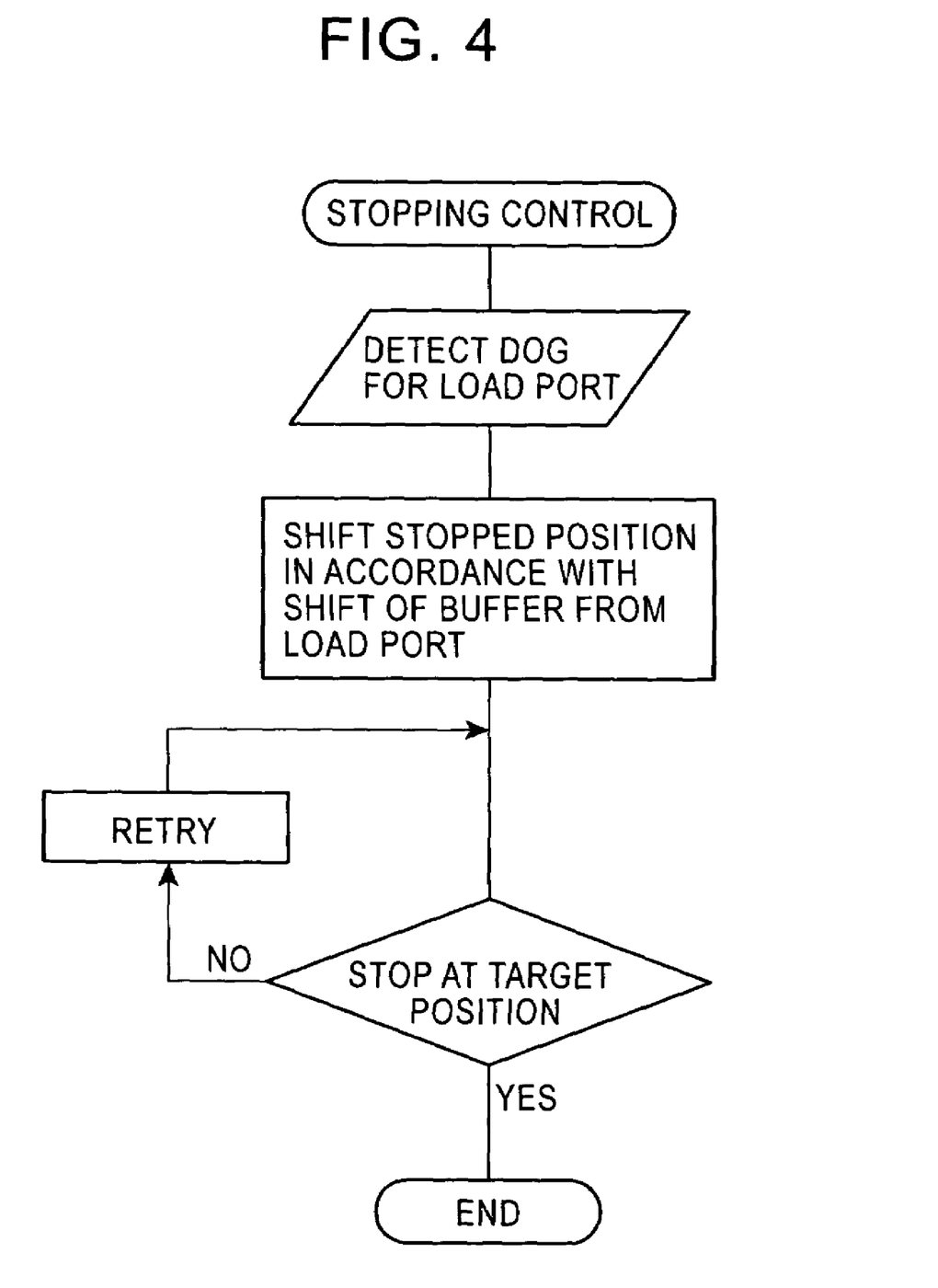
FIG. 4 is a flow chart showing control of stopping at the overhead buffer.
Figure 5:
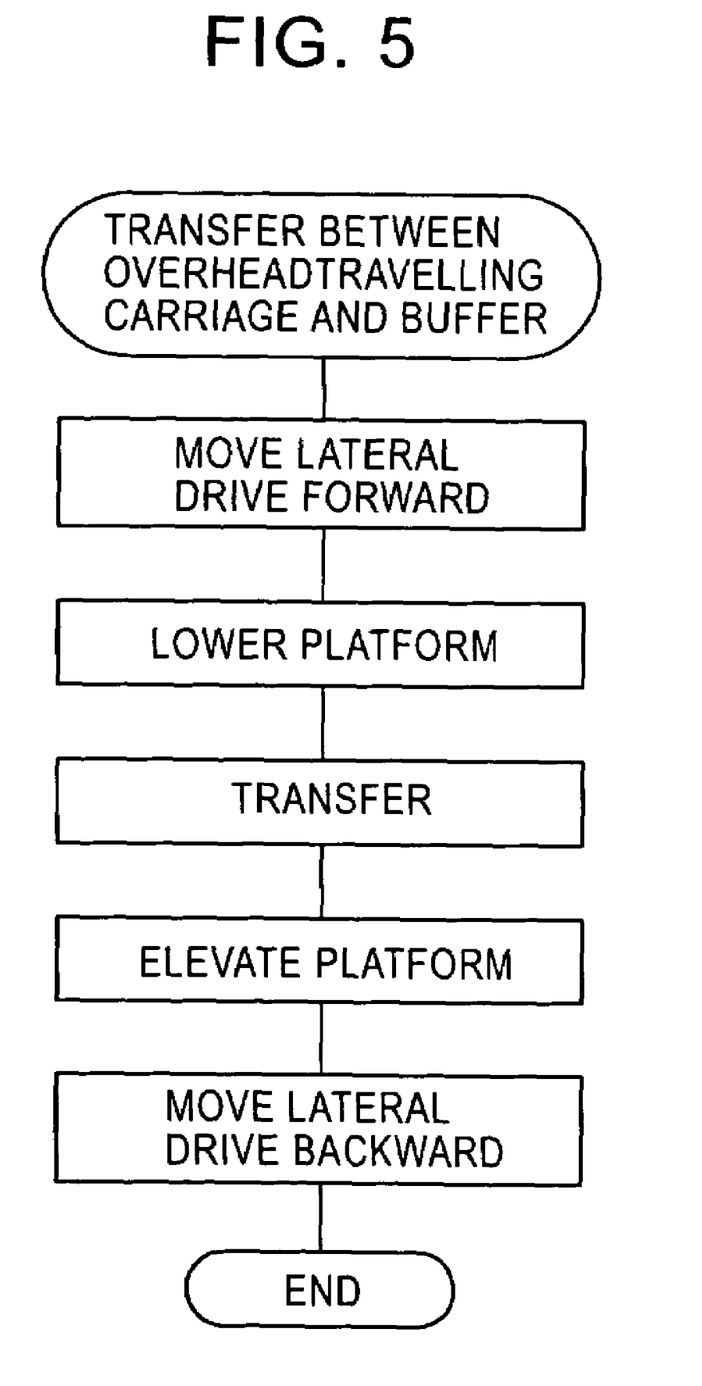
FIG. 5 is a flow chart showing control of a transfer between the overhead travelling carriage and the overhead buffer.
Figure 6:
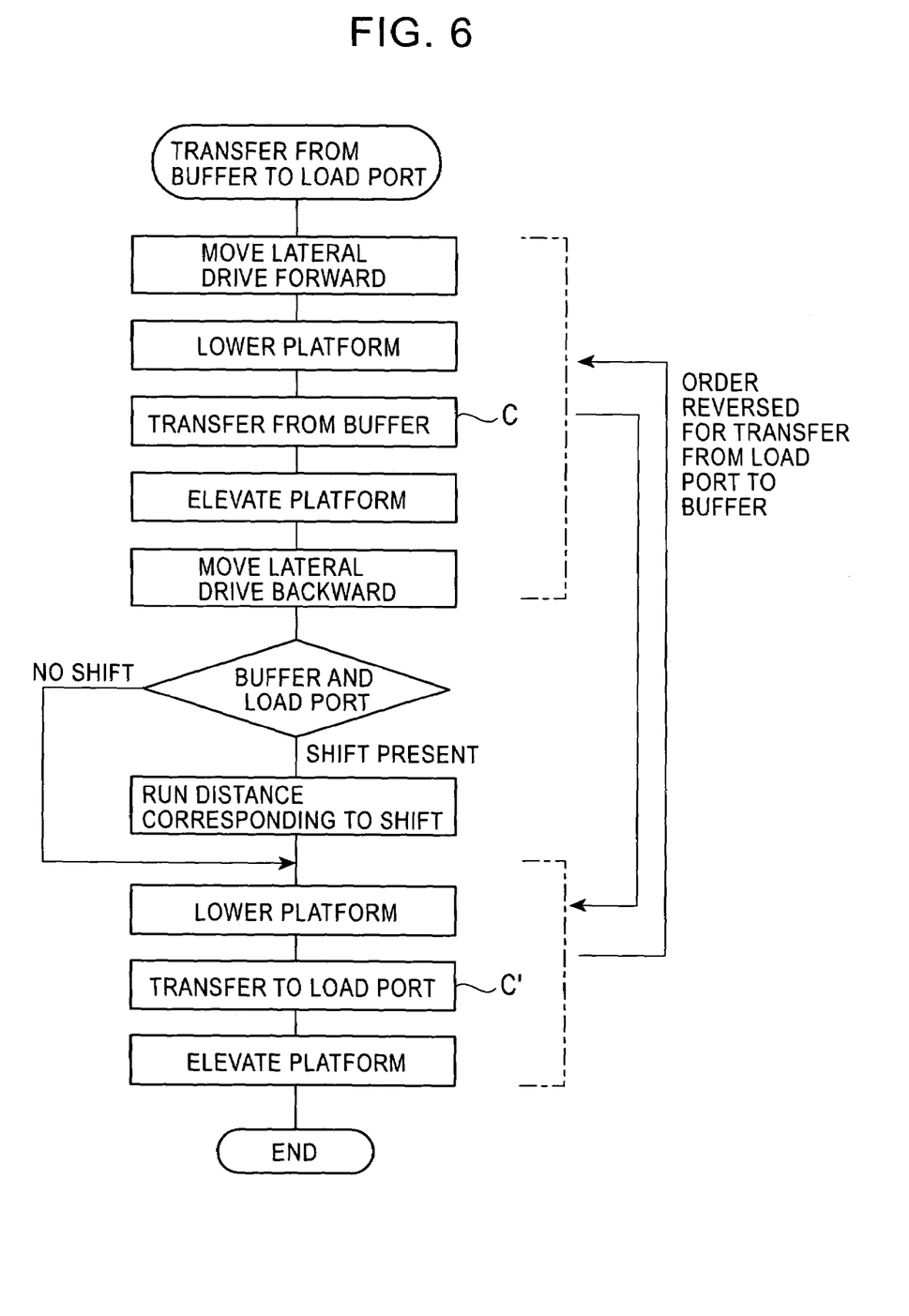
FIG. 6 is a flow chart showing control of a transfer from the overhead buffer to a load port.

FIGS. 4 to 6 show the control of stopping of the overhead travelling carriage 8 and the loading of the article on the overhead buffer 24 or load port 52. If the overhead travelling carriage 8 stops at the load port 52, stopping control may be performed in accordance with a dog detection signal. In the embodiment, the overhead buffer 24 is located at the same position as that of the load port 52 along the running direction of the overhead travelling carriage 8. Accordingly, by performing the same control as that performed to stop the load port 52, it is possible to stop the overhead at the correct position. If the overhead buffer 24 is shifted from the load port 52, the stopped position may be changed in accordance with the shift.

To transfer the article between the overhead travelling carriage 8 and the overhead buffer 24, the lateral drive of the lateral feeding section 14 is used to move the elevation driving section 16 forward to the overhead buffer 24. Then, the platform 18 is lowered. While the lateral drive is being moved forward or backward, the bottom surface of the article lies slightly above the fall preventing fence 26 or positioning pins 31 of the overhead buffer 24. Consequently, the lateral drive does not cause any interference. When the platform 18 is lowered to load the cassette 22 on the overhead buffer 24, the cassette 22 may be guided using the positioning pins 31. Then, the positioning pins 31 and the fall preventing fence 26 are used to prevent the cassette 22 loaded on the overhead buffer 24 from falling even with a strong force acting during an earthquake. After the loading, the platform 18 may be elevated and the lateral drive is moved backward. Only a small stroke is required to lower and elevate the platform 18 during the above process. Further, only a short time is required for the loading.

FIG. 6 shows a transfer from the overhead buffer 24 to the load port 52. In the embodiment, the overhead buffer 24 is located at the same position as that of the load port 52 along the running direction of the overhead travelling carriage 8. Consequently, the overhead travelling carriage 8 need not run during a transfer. If the cassette 22 is transferred from the overhead buffer 24 to the load port 52, the lateral drive is moved forward to the overhead buffer 24. Further, the platform 18 is lowered and the cassette 22 is transferred from the overhead buffer 24 to the platform 18. This step is called step (c). Then, the platform 18 is elevated, and the lateral drive is moved backward. If there is a positional shift between the overhead buffer 24 and the load port 52 in the running direction, the overhead travelling carriage 8 is run by a distance corresponding to the shift. Since the load port 52 is located immediately below the overhead travelling carriage 8, the platform 18 is lowered, and the cassette 22 is loaded on the load port 52. This step is called step (c'). Then, the platform 18 is elevated to complete the transfer.

For a transfer from the load port 52 to the overhead buffer 24, the order of the latter three steps in FIG. 6 and the former five steps in FIG. 5 may be reversed. In this case, for a transfer to the load port 52 in the step (c'), the cassette 22 is transferred from the load port 52 to the platform 18. Further, in the step (c), the cassette 22 is transferred from the platform 18 to the overhead buffer 24 instead of from the overhead buffer 24 to the platform 18.

The embodiment produces the effects below.

(1) An additional overhead buffer can be installed even if there is no space enough to provide the overhead buffer between the load ports. This improves the conveyance efficiency of the overhead travelling carriage system.

(2) The overhead buffer can be provided at such a height as prevents its own interference with the operator. In particular, the overhead buffer is located slightly below the bottom surface of the article conveyed on the overhead travelling carriage. This allows a large space to be created below the overhead buffer. It is also possible to reduce the elevation stroke of the platform when the article is transferred between the overhead buffer and the overhead travelling carriage.

(3) The overhead buffer and the load port are located at almost the same position along the running direction of the overhead travelling carriage. Then, the dog for controlling stopping at the load port can be used to control stopping at the overhead buffer. As a result, the dog can be easily attached to the rail. It is also possible to eliminate the need to run the overhead travelling carriage during the transfer between the load port and the overhead buffer. Alternatively, it is possible to reduce the distance that the overhead travelling carriage runs during this period.

(4) When the positioning pins are provided on the overhead buffer, the overhead buffer can be guided when loading the cassette. This is also effective in preventing the cassette from falling. Further, the provision of the fall preventing fence ensures the prevention of, for example, a fall during an earthquake.

(5) The opening formed in the overhead buffer prevents the flow of clean air from being blocked.

(6) When the material for the overhead buffer is transparent or the opening is formed in the overhead buffer, the overhead buffer can be visually checked for the presence of a cassette easily.

Figure 7:
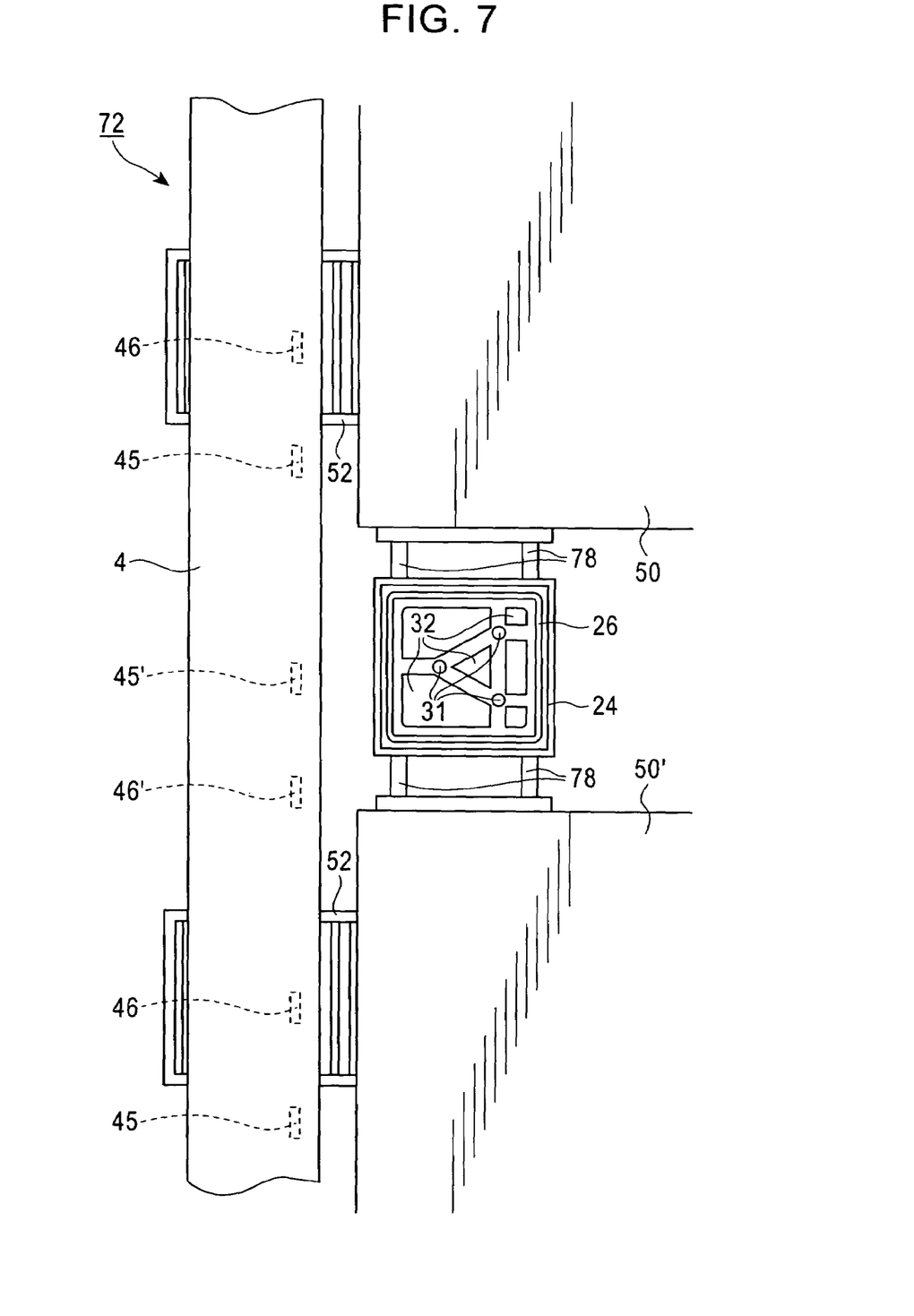
FIG. 7 is a plan view of an essential part of a variation, showing a running rail for an overhead travelling carriage and an overhead buffer.

FIG. 7 shows an overhead travelling carriage system 72 according to a variation. The same reference numerals as those in FIGS. 1 to 6 represent the same components.

The description of the embodiment shown in FIGS. 1 to 6 applies to the variation as it is unless otherwise stated. In the variation shown in FIG. 7, the overhead buffer 24 for one or more cassettes 22 is provided between processing devices 50, 50'. The overhead buffer 24 is hung from, for example, the processing devices 50, 50' in a supportive manner using a pipe 78 or the like. The position at which the overhead travelling carriage 8 stops varies between the overhead buffer 24 and the load port 52. Accordingly, dogs 45', 46' are provided to control stopping at the overhead buffer 24. The height of the overhead buffer 24 is similar to that in FIG. 1. The top portion of the fall preventing fence 26 is located slightly below the bottom surface of the cassette 22 conveyed on the overhead travelling carriage 8. In the variation shown in FIGS. 7 and 8, the overhead travelling carriage 8 can freely deliver and receive the cassette 22 to and from overhead buffers 24 arranged on the right and left sides of the running rail 4.

Figure 8:
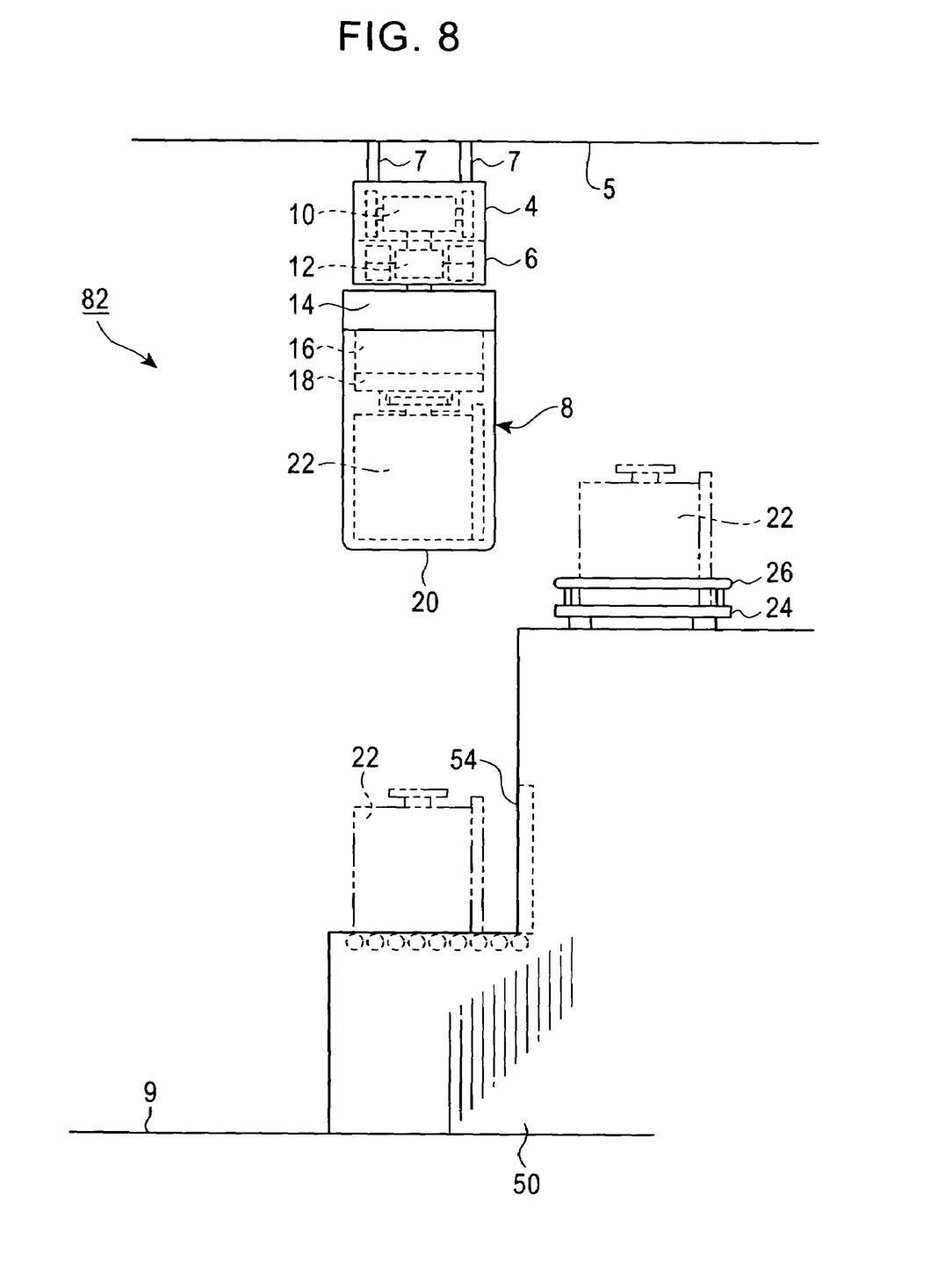
FIG. 8 is a front view showing an overhead travelling carriage and an overhead buffer according to a second variation.

An overhead travelling carriage system 82 shown in FIG. 8 is an example in which the overhead buffer 24 is installed on the top surface of the processing device 50. If the processing device 50 is replaced with a trailer one, the overhead buffer 24 is removed. In this example, the height of the overhead buffer 24 is also such that the top portion of the fall preventing fence 25 is located slightly above the bottom surface of the cassette 22 conveyed is similar to the embodiment shown in FIGS. 1 to 6.

The invention claimed is:

1. An overhead travelling carriage system comprising:
    an overhead travelling carriage that elevates and lowers a platform to load an article on a load port in a processing device provided below a running rail, the overhead travelling carriage running along the running rail,
    wherein an overhead buffer is fixed, and is provided on a side of said running rail which is opposite the processing device with respect to the running rail, so that an article placement surface is located below a bottom surface of the article on the running overhead travelling carriage,
    wherein the overhead travelling carriage is provided with means for laterally moving said platform to above the overhead buffer so that the article can be transferred and loaded between the overhead buffer and the load port located below the running rail,
    wherein a means for preventing the article from falling is provided so as to project upward from said overhead buffer, and a top portion of the fall preventing means is located slightly below a bottom surface of the article on the running overhead travelling carriage,
    wherein said means for preventing the article from falling comprises a fall preventing fence and a plurality of positioning pins, said fall preventing fence extending upward above said positioning pins,
    wherein an opening is formed in said overhead buffer so as not to block a flow of clean air blown downward from a ceiling to a floor, and
    wherein said overhead buffer is hung in supportive manner by two or more parallel supports from a ceiling from which said running rail is hung.

2. An overhead travelling carriage system according to claim 1, wherein said overhead buffer is placed so that the article can be transferred to the overhead travelling carriage at almost the same position as that of said load port in a plan view and with respect to a running direction of the running rail.

3. An overhead travelling carriage system comprising:
    an overhead travelling carriage that elevates and lowers a platform to load an article on a load port in two or more processing devices provided below a running rail, the overhead travelling carriage running along the running rail,
    wherein an overhead buffer is provided on a side of said running rail so that an article placement surface is located below a bottom surface of the article on the running overhead travelling carriage,
    wherein the overhead buffer is hung in a supportive manner between two of said two or more processing devices by connecting members which fix said overhead buffer directly to said two of said two or more processing devices,
    wherein the overhead travelling carriage is provided with means for laterally moving said platform to above the overhead buffer so that the article can be transferred and loaded between the overhead buffer and the load port located below the running rail,
    wherein a means for preventing the article from falling is provided so as to project upward from said overhead buffer, and a top portion of the fall preventing means is located slightly below a bottom surface of the article on the running overhead travelling carriage, and
    wherein said means for preventing the article from falling comprises a fall preventing fence and a plurality of positioning pins, said fall preventing fence extending upward above said positioning pins.

4. An overhead travelling carriage system according to claim 3, wherein said overhead buffer is placed so that the article can be transferred to the overhead travelling carriage at almost the same position as that of said load port in a plan view and with respect to a running direction of the running rail.

5. An overhead travelling carriage system comprising:
    an overhead travelling carriage that elevates and lowers a platform to load an article on a load port in a processing device provided below a running rail, the overhead travelling carriage running along the running rail,
    wherein an overhead buffer is provided on a side of said running rail so that an article placement surface is located below a bottom surface of the article on the running overhead travelling carriage,
    wherein the overhead buffer is disposed on a top-most surface of said processing device,
    wherein the overhead travelling carriage is provided with means for laterally moving said platform to above the overhead buffer so that the article can be transferred and loaded between the overhead buffer and the load port located below the running rail,
    wherein a means for preventing the article from falling is provided so as to project upward from said overhead buffer, and a top portion of the fall preventing means is located slightly below a bottom surface of the article on the running overhead travelling carriage,
    wherein said means for preventing the article from falling comprises a fall preventing fence and a plurality of positioning pins, said fall preventing fence extending upward above said positioning pins, and
    wherein said load port is disposed below said overhead buffer.

6. An overhead travelling carriage system according to claim 5, wherein said overhead buffer is placed so that the article can be transferred to the overhead travelling carriage at almost the same position as that of said load port in a plan view and with respect to a running direction of the running rail.

* * * * *